United States Patent [19]

Nitta

[11] Patent Number: 4,645,866

[45] Date of Patent: Feb. 24, 1987

[54] PHOTOVOLTAIC DEVICE AND A METHOD OF PRODUCING THE SAME

[75] Inventor: Yoshiteru Nitta, Shiga, Japan

[73] Assignee: Kyocera Corporation, Kyoto, Japan

[21] Appl. No.: 766,133

[22] Filed: Aug. 15, 1985

[30] Foreign Application Priority Data

Aug. 18, 1984 [JP] Japan .................................. 59-172222
May 31, 1985 [JP] Japan .................................. 60-119335

[51] Int. Cl.⁴ ...................... H01L 27/14; H01L 31/18
[52] U.S. Cl. ................................... 136/244; 136/258;
29/572; 29/580; 29/591
[58] Field of Search ................... 136/244, 258 AM;
29/572, 580, 591

[56] References Cited

U.S. PATENT DOCUMENTS 4,315,096  2/1982  Tyan et al. .......................... 136/244
4,518,815  5/1985  Yamazaki ........................... 136/244

FOREIGN PATENT DOCUMENTS 56-13779  2/1981  Japan ............................ 136/258 AM
59-103383  6/1984  Japan ............................ 136/258 AM Primary Examiner—Aaron Weisstuch Attorney, Agent, or Firm—Spensley Horn Jubas & Lubitz

[57] ABSTRACT

A photovoltaic device including a plurality of power generation regions horizontally connected one after another over an insulative substrate, each power generation region being composed of a lower electrode, an amorphous semiconductor, and an upper electrode, and the upper electrode of one of two adjacent power generation regions being connected to the lower electrode of the other power generation region, the photovoltaic device being characterized in that an isolation wall defined by a vertical slot is provided at the end of the connection side of the power generation region and extended to the surface of the lower electrode so as to disconnect the amorphous semiconductor and the upper electrode located over the lower electrode at the end of the connection side, and wherein whereby a conductive connection section is formed by filling and firing conductive material into a vertical gap between the isolation wall and the upper electrode of one of the two adjacent power generation regions and the lower electrode at the other power generation region to electrically connect the upper electrode to the lower electrode.

19 Claims, 9 Drawing Figures

PHOTOVOLTAIC DEVICE AND A METHOD OF PRODUCING THE SAME

BACKGROUND OF THE INVENTION

1. Field of the Invention

The present invention relates to a photovoltaic device, such as a solar cell assembly or a photosensor assembly, comprising amorphous semiconductor layers, wherein a plurality of power generation regions formed over one side of a substrate are arranged and connected in series, and a method of producing the photovoltaic device.

2. Prior Art

FIG. 4 is a cross-sectional view illustrating a construction of a conventional photovoltaic device in which power generation regions are connected in series. Referring to FIG. 4, numeral 21 designates an insulative substrate, numerals 22a and 22b designate the first electrodes (hereafter referred to as lower electrodes) coated over the substrate 21, numerals 23a and 23b designate amorphous semiconductor layers coated over the lower electrodes 22a and 22b respectively, and numerals 24a and 24b designate the second electrodes (hereafter referred to as upper electrodes) coated over the amorphous semiconductor layers 23a and 23b respectively. The insulative substrate 21 is a glass substrate which allows visible light to pass through, or a ceramic substrate. Among the lower and upper electrodes (22a, 22b, 24a, and 24b), those on the light incidence side are made of transparent tin oxide or indium oxide, and those on the other side are made of a non-transparent metal, such as aluminum, chromium or nickel.

The amorphous semiconductor layers 23a and 23b, which generate electrons when illuminated, have a construction of three layers (only one layer is shown in FIG. 4) comprising from the substrate a P-type layer, an i-type (non-doped) layer, and an N-type layer. The photovoltaic device described above has disadvantages, in particular in the method of production thereof. This method uses a metallic mask (not shown) having lower-electrode-shaped holes depending on the shape of the power generation regions (a', b' ... ).

First, the mask is placed on the insulative substrate 21 and the lower electrodes 22a and 22b are coated over the insulative substrate 21 using a lower electrode forming unit. Then, the mask is moved by a specified distance in the arrangement direction of the lower electrodes 22a and 22b to cover the lower electrodes 22a and 22b with the mask. The amorphous semiconductor layers 23a and 23b are coated over the lower electrodes 22a and 22b using a plasma CVD unit. The mask is further moved by said specified distance in the same direction onto the amorphous semiconductor layers 23a and 23b. Then, the upper electrodes 24a and 24b are coated over the amorphous semiconductor layers 23a and 23b using an upper electrode forming unit.

As a result, the conventional photovoltaic device in which the upper electrode 24a of the power generation region a' is connected to the lower electrode 22b of the adjacent power generation region b' is produced. (Refer to Japanese Provisional Patent Publication 48-26977.)

Another production method is described below. The lower electrodes 22a and 22b having the specified shape are formed on the substrate 21, and the amorphous semiconductor layers 23a and 23b are coated over the lower electrodes 22a and 22b. The unnecessary portions of the amorphous semiconductor layers 23a and 23b are removed by plasma etching, reverse sputtering or laser beam irradiation via a mask. Next, the upper electrodes 24a and 24b are coated over the amorphous semiconductor layers 23a and 23b. By removing the unnecessary portions of the upper electrodes 24a and 24b in the same way as described above, the conventional photovoltaic device in which the power generation regions are connected in series can also be produced. (Refer to Japanese Patent Provisional Publication 57-12568.)

When the power generation regions a' and b' of the conventional photovoltaic device described above are illuminated, electrons are generated in the amorphous semiconductor layers 23a and 23b. As a result, a potential difference is generated between the lower electrode 22a and the upper electrode 24a and between the lower electrode 22b and the upper electrode 24b.

In addition, since the upper electrode 24a of the power generation region a' is electrically connected to the lower electrode 22b, of the power generation region b', and the electromotive force of the power generation region a' is added to that of the power generation region b'.

However, it is necessary to frequently move a mask or use a plurality of masks to obtain series connections of electrodes when the conventional photovoltaic device is produced. This production method causes problems. That is, layers may be damaged when the mask is placed and removed, and improper connection may be caused due to improper operation.

In addition, since the lower electrode and upper electrode, both having a thickness of approximately 1 μm, are placed one over another at the connection region, the photovoltaic device has a large series resistance when a plurality of power generation regions are connected in series. Therefore, it was difficult to obtain sufficient photovoltaic output.

SUMMARY OF THE INVENTION

It is, therefore, an object of the present invention to provide a photovoltaic device which is free of the aforementioned defects, more particularly, a photovoltaic device which can deliver sufficient output from series connection of a plurality of power generation regions.

Another object of the present invention is to provide a production method of this photovoltaic device.

The objects of the present invention are attained by a photovoltaic device arranged such that the lower electrode of one of the two adjacent power generation regions connected to the upper electrode of the other power generation region comprises an isolation wall defined by a vertical slot provided at the end of the connection side of the power generation region and extended onto the surface of the lower electrode so as to disconnect the amorphous semiconductor and the upper electrode located over the lower electrode at the end of the connection side whereby a conductive connection section is formed by filling and firing conductive material into a vertical gap between the isolation wall and the upper electrode of one of the two adjacent power generation regions and the lower electrode at the other power generation region to electrically connect the upper electrode to the lower electrode.

The objects will become apparent when a preferred embodiment of the present invention is considered in connection with the accompanying drawings.

DETAILED DESCRIPTION OF THE INVENTION

Figure 3:
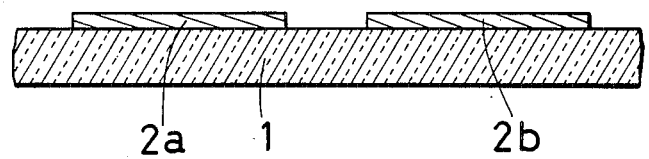
FIGS. 3 (a) to 3 (f) are vertical sectional views illustrating the production method of the photovoltaic device shown in FIG. 1.
Figure 3:
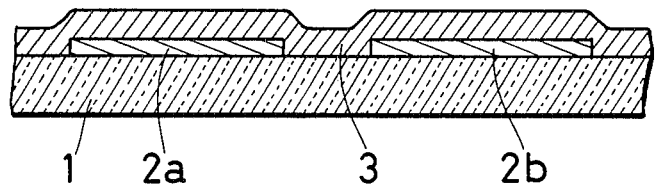
Figure 3:
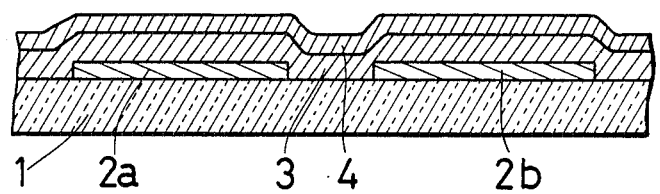
Figure 3:
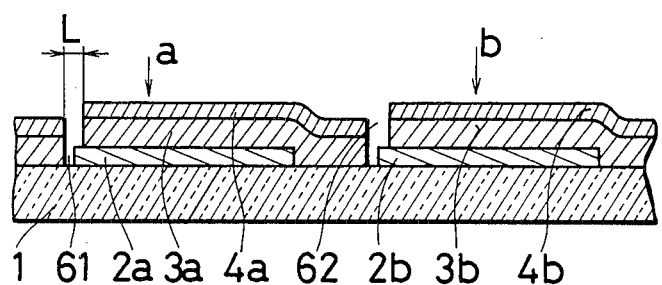
Figure 3E:
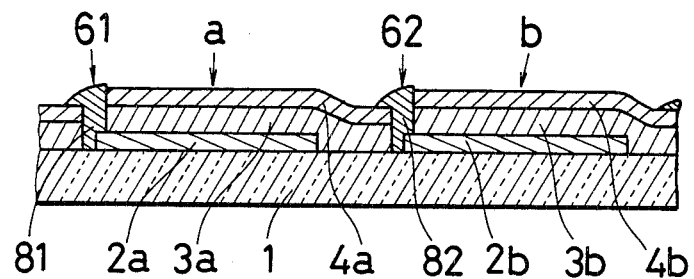
Figure 3F:
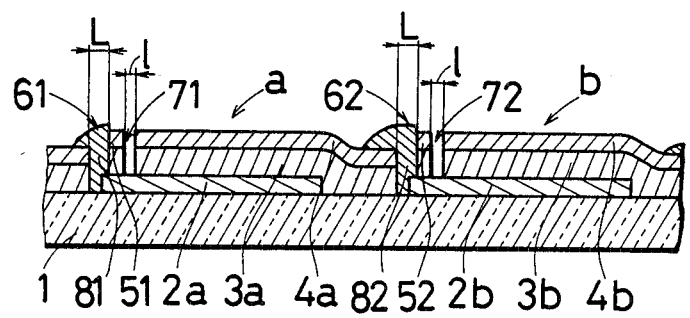
Figure 4:
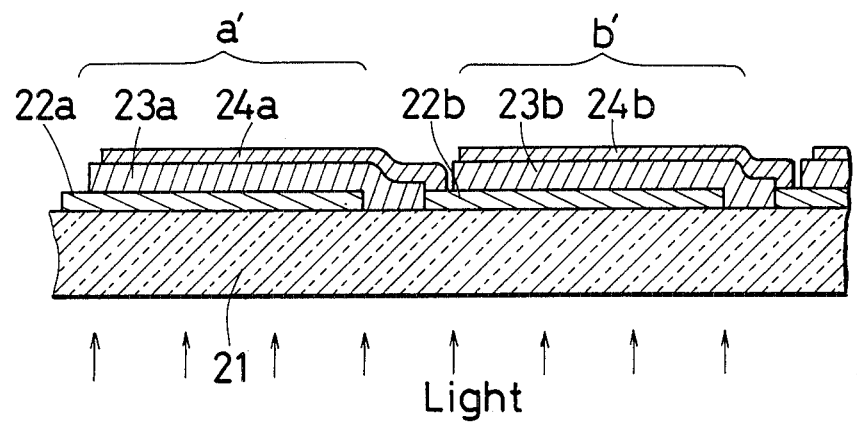
FIG. 4 is a vertical sectional view illustrating a conventional solar cell device.

The photovoltaic device of the present invention composed of a plurality of power generation regions connected in series and the production method of the photovoltaic device will be detailed referring to FIGS. 3 (a) to (f).

Referring first to FIG. 3 (a), a plurality of lower electrodes 2a and 2b having a specific shape are coated on one side of an insulative substrate 1 which is made of glass for example. The lower electrodes 2a and 2b are made by sputtering at an argon pressure of $5.0 \times 10^{-2}$ Torr using indium tin oxide as a target thereby depositing indium tin oxide (ITO) on the substrate 1. Instead of indium tin oxide, tin oxide or indium oxide can be used as transparent conductive films.

Referring to FIG. 3 (b), the substrate 1 over which a plurality of the lower electrodes 2a and 2b are formed is transferred to a plasma CVD unit. In the plasma CVD unit, the specified reaction gas is glow-discharged to coat an amorphous semiconductor layer 3 which covers the entire surfaces of the lower electrodes 2a and 2b.

The amorphous semiconductor layer 3 may be composed of a P-i-N type amorphous silicon layer. A reaction gas which is a mixture of silane ($SiH_4$), diborane ($B_2H_6$), and hydrogen ($H_2$) at a specified ratio is first introduced into the reaction chamber of the plasma CVD unit at a specified flowrate. In the reaction chamber, the gas pressure is maintained at a specified value and the substrate 1 is heated to 150° to 250° C. The reaction gas is glow-discharged by applying high-frequency voltage (13.56 Mhz). The reaction gas plasma generates a P-type amorphous silicon layer on the lower electrodes 2a and 2b of the substrate 1.

Then, a reaction gas which is a mixture of $SiH_4$ and $H_2$ at a specified ratio is glow-discharged in the same way as described above to generate an i-type amorphous silicon layer on the P-type amorphous silicon layer. Furthermore, a reaction gas which is a mixture of $SiH_4$, $PH_4$, and $H_2$ at a specified ratio is glow-discharged in the same way as described above to generate an n-type amorphous silicon layer on the i-type amorphous silicon layer. The film thickness of the amorphous silicon layers laminated in this way is approximately 0.5 to 1 μm. The amorphous silicon layers can be laminated in tandem to have greater spectral sensitivity characteristics over a wider wavelength range. Carbon (C), nitrogen (N), tin (Sn), lithuim (Li), oxygen (O), fluorine (F), germanium (Ge), and selenium (Se) can also be used as the major components of the reaction gases described above.

Referring to FIG. 3 (c), an upper electrode layer 4, which is separated into respective upper electrodes 4a and 4b, is coated over the entire surface of the amorphous semiconductor layer 3. The upper electrode layer 4 is deposited by evaporating a metal such as nickel (Ni), chromium (Cr), or aluminum (Al). Since the upper electrode layer 4 is continuously formed over the amorphous semiconductor layer 3, it is not necessary to change masks in this production process step. Therefore, the amorphous semiconductor layer 3 and other layers are prevented from being damaged due to placement and removal of masks. Moreover, the reaction chamber of the plasma CVD unit can be connected to the reaction chamber of the metal evaporation unit to form an in-line system.

FIG. 3 (d) illustrates a process step to obtain a plurality of independent power generation regions (a, b, . . . ), comprising lower electrodes (2a, 2b, . . . ), amorphous semiconductor layers (3a, 3b, . . . ) and upper electrodes (4a, 4b, . . . ) over the substrate 1, by removing the upper electrode layer 4 and the amorphous semiconductor layer 3 at the area between the two adjacent lower electrodes 2a and 2b to provide vertical gaps 61 and 62 so that the substrate 1 and the lower electrodes 2a and 2b are partially exposed.

Etching using laser beam irradiation or etching using resist film and etching liquid can be used to remove the upper electrode layer 4 and the amorphous semiconductor layer 3 and to provide the slots 61 and 62. However it is preferable to use laser beam irradiation to simplify production processes. The second harmonic of 0.53 μm of the YAG ($Y_3Al_5O_{12}$) yttrium garnet laser is used as the laser light. This laser is very advantageous since it does not damage the substrate 1 and the lower electrodes 2a and 2b made of indium oxide or tin when removing the amorphous semiconductor layer 3 and the upper electrode layer 4 made of a thin metal film.

FIG. 3 (e) illustrates a process step to form conductive connection sections 81 and 82 by filling a low resistance metal such as silver into the gaps 61 and 62 which were formed in the previous process step. More particularly, the conductive connection sections 81 and 82 are formed by filling conductive metal paste such as silver paste into the gaps 61 and 62 by printing using thick-film techniques and by firing the paste to electrically connect power generation regions a and b with each other.

The conductive connection sections 81 and 82 can also be formed by evaporating a conductive metal having small resistance to electrically connect power generation sections a and b with each other.

FIG. 3 (f) illustrates a process step to separate the electrically connected power generation regions a and b from each other so that they are connected in series.

Vertical slots 71 and 72 for insulation are formed so that the lower electrode 2a of the power generation region a and the lower electrode 2b of the power generation region b are exposed. More particularly, a laser beam is irradiated from above the upper electrodes 4a and 4b to partially remove the upper electrodes 4a and 4b and the amorphous semiconductor layers 3a and 3b to form the slots 71 and 72. In this way, the power generation regions a and b are connected in series with each other. That is, an electrical connection is made from the lower electrode 2a to the amorphous semiconductor layer 3a, the upper electrode 4a of the power generation region a, the conductive connection section 82, the lower electrode 2b, the amorphous semiconductor layer 3b, and the upper electrode 4b of the power generation region b.

The laser beam can also be irradiated at the positions contacting the conductive sections 81 and 82 to expose the lower electrodes 2a and 2b. In this case, however, it is difficult to properly align the laser beam irradiation positions. If the positions are improperly aligned, the conductive connection sections 81 and 82 may be removed, disconnecting the electrical connections at the conductive connection sections 81 and 82. To solve this problem, isolation walls 51 and 52 are formed on the lower electrodes 2a and 2b by providing the slots 71 and 72.

Figure 1:
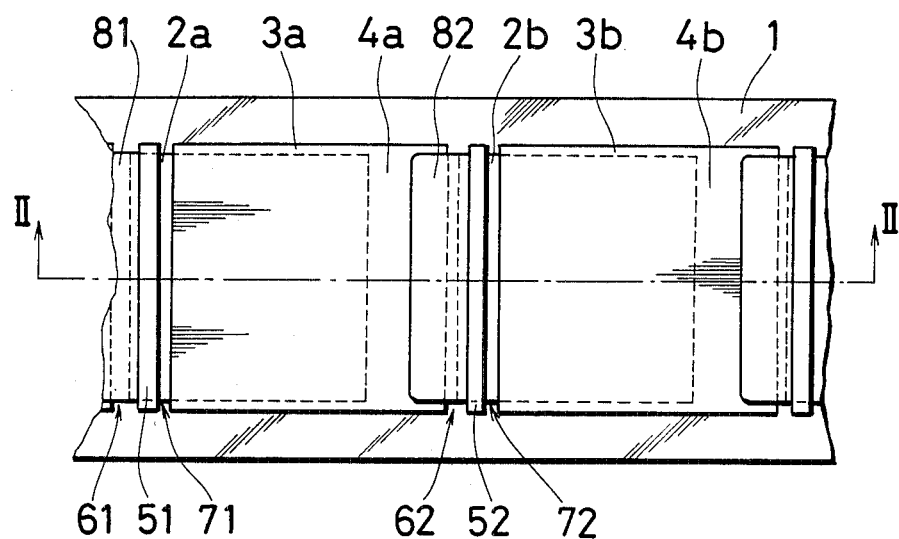
FIG. 1 is a detailed plan view of the photovoltaic device of the present invention, taking a solar cell assembly as an example, whose power generation regions are connected in series.
Figure 2:
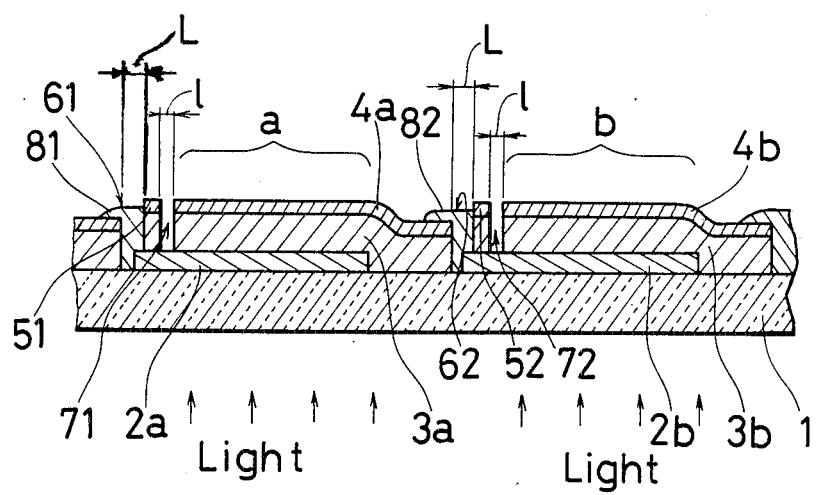
FIG. 2 is a vertical sectional view taken substantially on line II—II of FIG. 1.

The photovoltaic device shown in FIG. 2 can be obtained by the production processes described above. With this device, a conductive material can be easily filled and fired to form the conductive connection sections 81 and 82 which electrically connect the power generation regions a and b with each other. Furthermore, the slots 71 and 72 formed by laser beam irradiation to prevent the electrical connection between the upper electrode 4a of the power generation region a and the upper electrode 4b of the power generation region b to ensure series connection.

Although the width of the slots 71 and 72 which form the isolation walls 51 and 52 and the width of the gaps 61 and 62 can be held down to a few micrometers by narrowing the laser beam irradiation, the width L of the gaps 61 and 62 should be at least 50 μm to allow current to flow through the conductive connection sections 81 and 82. On the other hand, the width 1 of the slots 71 nd 72 can be as little as 5 μm so as to prevent the upper electrode 4a of the power generation region a and the upper electrode 4b of the power generation region b from contacting each other.

In the above description of the embodiment of the present invention, the substrate 1 is made of a transparent insulator substrate so that light impinges from the substrate 1 of each power generation region onto a transparent lower electrode, an amorphous semiconductor layer and a metallic thin-film upper electrode, in that order. However, it will be obvious to those skilled in the art that the photovoltaic device of the present invention is not limited to use of such a transparent substrate.

An insulative substrate made of ceramic can also be used as the substrate 1 so that light impinges from a transparent upper electrode of a power generation region onto an amorphous semiconductor layer and a lower electrode made of a metallic thin film.

With the photovoltaic device of the present invention described above, the connection region is made of a conductor having an extremely small electric resistance, which is formed by thick-film techniques, to deliver higher photovoltaic output. Furthermore, the lower electrode does not directly contact the upper electrode. This prevents these elecrodes from being deteriorated due to oxidation.

Moreover, the gaps are disposed in the amorphous semiconductor layer and the upper electrode layer continuously coated over a plurality of lower electrodes and are filled with a conductive material and fired to form the conductive connection sections and to connect the power generation regions in series. Thus, when the conductive material is filled within the gaps accurate positioning with a few micrometers is not necessary and the conductive material can be easily applied. Since the power generation regions are connected in series in the final process, even if the conductive material protrudes from the gaps, the material can be prevented from expanding to the upper electrode of the adjacent power generation region by the isolation wall.

Moreover, since the power generation regions can be connected in series by simply providing the gaps, the productivity of the photovoltaic device of the present invention is very high.

Having described my invention as related to the embodiment shown in the accompanying drawing, it is my intention that the invention not be limited by any of the details of description, unless otherwise specified, but rather be construed broadly within its spirit and scope as set out in the accompanying claims.

I claim:

1. A photovoltaic device including a plurality of power generation regions electrically series connected one after another over one side of an insulative substrate, each said power generation region being composed of three layers comprising a lower electrode, an amorphous semiconductor, and an upper electrode laminated in that order, and said upper electrode of one of each pair of adjacent power generation regions being connected to said lower electrode of the other adjacent power generation region, said photovoltaic device being characterized in that an isolation wall defined by a vertical slot is provided at the end of the connection side of said power generation region and extended to the surface of said lower electrode so as to disconnect the amorphous semiconductor and upper electrode portion comprising said isolation wall located over said lower electrode at the end of said connection side, and wherein a conductive series electrical connection section is formed by filling electrically conductive material into a vertical gap formed between said upper electrode of said one of said pair of adjacent power generation regions and said isolation wall and said lower electrode at the other adjacent power generation region to thereby electrically connect said upper electrode to said lower electrode.

2. A photovoltaic device according to claim 1, wherein said slot is formed by a method selected from the group consisting of plasma etching, reverse sputtering, and laser beam irradiation.

3. A photovoltaic device according to claim 2, wherein a YAG laser is used as said laser.

4. A photovoltaic device according to any one of claims 1, 2 or 3, wherein said electrically conductive material comprises fired metal paste.

5. A photovoltaic device according to any one of claims 1, 2 or 3, wherein said electrically conductive material comprises an evaporated metal.

6. A photovoltaic device according to claim 1, wherein said insulative substrate is a glass substrate, said lower electrode is a transparent conductive film selected from the group consisting of indium tin oxide, tin oxide, and indium oxide, said amorphous semiconductor layer is a P-i-N type amorphous silicon layer, said upper electrode is a nontransparent conductive film , and said conductive material is conductive silver paste.

7. A photovoltaic device according to claim 1, wherein said conductive series electrical connection is formed by a thick layer forming technique.

8. A method of producing a photovoltaic device, comprising the steps of (a) coating a plurality of spaced apart lower electrodes over one side of an insulative substrate, (b) continuously coating an amorphous semiconductor layer and an upper electrode layer over said plurality of lower electrodes, (c) forming a plurality of power generation regions comprising said lower electrodes, said amorphous semiconductor layer and said upper electrode layer over said substrate into plural sections by selectively partially removing said upper electrode layer and said amorphous semiconductor layer between each pair of adjacent lower electrodes to form a gap so that one of each said pair of lower electrodes and said substrate is exposed, (d) filling an electrically conductive material in said gap to form a conductive connection section for series electrically connecting said upper electrode of each one of said pair of adjacent power generation regions to said lower electrode of the other adjacent power generation region, and (e) forming a vertical slot reaching said lower electrode in at least said power generation region so that said upper electrodes of adjacent power generation regions are not electrically connected while the electrical connection between said upper electrode of each one of said pairs of adjacent power generation region and said lower electrode of the other adjacent power generation region is maintained.

9. A method of producing a photovoltaic device according to claim 8, wherein said gap and slot are made by a process selected from the group consisting of plasma etching, reverse sputtering, and laser beam irradiation.

10. A method of producing a photovoltaic device according to claim 9, wherein said laser beam is selected from the second harmonic of a YAG laser.

11. A method of producing a photovoltaic device according to any one of claims 8, 9 or 10, wherein said electrically conductive material comprises metal paste.

12. A method of producing a photovoltaic device according to any one of claims 8, 9 or 10 wherein said electrically conductive material comprises evaporated metal.

13. A method of producing a photovoltaic device according to claim 8, wherein said insulative substrate is a glass substrate, said lower electrode is coated by sputtering indium tin oxide, tin oxide, or indium oxide, said amorphous silicon layer is of P-i-N type formed by plasma-glow discharging, said upper electrode is formed by evaporating a metal selected from the group consisting of Ni, Cr, Al, and said conductive material comprises printed and fired silver paste.

14. A photovoltaic device, comprising:
an insulative substrate, said insulative substrate having a first portion and a second portion;
a first lower electrode layer formed upon the first portion of said insulative substrate;
a second lower electrode layer formed upon the second portion of the insulative substrate;
a first semiconductor layer formed upon the first lower electrode layer;
a second semiconductor layer formed upon the second lower electrode layer;
a first upper electrode layer formed upon the first semiconductor layer, said first upper electrode layer and said second lower electrode layer having no common point of physical contact;
a second upper electrode layer formed upon the second semiconductor layer, said second semiconductor layer and second upper electrode layer having a slot therein to separate each of them into a first portion and a second portion; and
conductive connection means for electrically connecting the first upper electrode layer with both the second lower electrode layer and the first portion of the second upper electrode layer, wherein the slot causes the first upper electrode layer to be electrically isolated from the second portion of the second upper electrode layer.

15. A method of producing a photovoltaic device, comprising:
providing an insulative substrate;
coating a first lower electrode over a first portion of the insulative substrate and a second lower electrode over a second portion of the insulative substrate, said first lower electrode being spaced apart from the second lower electrode to form a gap therebetween;
coating a semiconductor layer directly upon both of the lower electrodes and the gap;
coating an upper electrode layer directly upon the semiconductor layer;
removing the semiconductor layer and the upper electrode layer over a portion of said gap and an adjacent area over a portion of the second lower electrode, the total area defined by the removed semiconductor layer and upper electrode layer thereby constituting a slot;
inserting low electrical resistance conductive connection material in the slot, thereby conductively connecting the second lower electrode with the portion of the upper electrode layer above the first lower electrode; and
removing the semiconductor layer and the upper electrode layer from an area above the second lower electrode at a point spaced apart from the slot to eliminate a direct electrical connection between the conductive connection material and a selected portion of both the semiconductor layer and upper electrode layer.

16. A method of producing a photovoltaic device, comprising:
providing an insulative substrate;
coating a first lower electrode over a first portion of the insulative substrate and a second lower electrode over a second portion of the insulative substrate, the first lower electrode being spaced apart from the second lower electrode to form a gap therebetween;
coating a semiconductor layer directly upon both of the lower electrodes and said gap;
coating an upper electrode layer directly upon the semiconductor layer;
removing the semiconductor layer and the upper electrode layer over a portion of the gap and an adjacent area over a portion of the second lower electrode, the total area defined by the removed semiconductor layer and upper electrode layer thereby constituting a slot;
inserting low electrical resistance conductive connection material in the entirety of the slot, thereby conductively connecting the second lower electrode with the portion of the upper electrode layer located above the lower electrode; and
removing the semiconductor layer and the upper electrode layer from an area above the second lower electrode at a point spaced apart from the slot to isolate a portion of the semiconductor layer and upper electrode layer from the conductive connection material.

17. A method of producing a photovoltaic device according to claim 15 or 16, wherein the low electrical resistance conductive connection is inserted into the slot by a thick layer forming technique.

18. A method of producing a photovoltaic device according to claim 15 or 16, wherein the low electrical resistance conductive connection is formed by metal evaporation.

19. A method of producing a photovoltaic device according to claim 15 or 16, wherein said slot is formed by a method selected from the group consisting of plasma etching, reverse sputtering, and laser beam etching.

* * * * *